United States Patent [19]

Barry et al.

[11] 4,281,448

[45] Aug. 4, 1981

[54] METHOD OF FABRICATING A DIODE BRIDGE RECTIFIER IN MONOLITHIC INTEGRATED CIRCUIT STRUCTURE UTILIZING ISOLATION DIFFUSIONS AND METAL SEMICONDUCTOR RECTIFYING BARRIER DIODE FORMATION

[75] Inventors: Vincent J. Barry, Hudson; Jeremiah P. McCarthy, Framingham, both of Mass.

[73] Assignee: GTE Laboratories Incorporated, Waltham, Mass.

[21] Appl. No.: 140,036

[22] Filed: Apr. 14, 1980

[51] Int. Cl.$^3$ ............... H01L 21/76; H01L 27/10; H01L 29/56

[52] U.S. Cl. ............... 29/577 C; 29/578; 29/590; 148/175; 148/187; 357/15; 357/44; 357/45; 357/76; 427/84

[58] Field of Search ............... 29/577 C, 577 R, 578, 29/590; 148/175, 187; 427/84; 357/15, 44, 45, 76

[56] References Cited

U.S. PATENT DOCUMENTS

| | | | |
|---|---|---|---|
| 3,506,893 | 4/1970 | Dhaka | 29/569 X |
| 3,638,079 | 1/1972 | Chan | 148/175 X |
| 3,699,362 | 10/1972 | Jordan | 357/15 X |
| 3,846,192 | 11/1974 | Murrmann | 29/577 C |
| 3,900,344 | 8/1975 | Magdo | 427/84 X |
| 3,906,540 | 9/1975 | Hollins | 357/15 |
| 3,909,837 | 9/1975 | Kronlage | 357/15 |
| 4,032,962 | 6/1977 | Balyoz et al. | 357/15 X |
| 4,091,296 | 5/1978 | Suzuki et al. | 357/44 X |
| 4,156,246 | 5/1979 | Pedersen | 357/44X |
| 4,174,541 | 11/1979 | Schmitz | 365/227 |

OTHER PUBLICATIONS

Noyce et al., "Schottky Diodes Make IC Scene," Electronics, Jul. 21, 1969, pp. 74–80.

Primary Examiner—L. Dewayne Rutledge
Assistant Examiner—W. G. Saba
Attorney, Agent, or Firm—David M. Keay

[57] ABSTRACT

Method of fabricating monolithic integrated circuit structure incorporating a full-wave diode bridge rectifier of four Schottky diodes. A body of silicon is produced by growing an epitaxial layer of N-type silicon on a P-type substrate. P-type imparting material is diffused into the layer to form isolating barriers delineating first and second N-type zones separated from each other by intervening P-type material and third and fourth N-type zones which are contiguous. A mixture of titanium and tungsten is deposited on portions of the zones and heated to form a mixed silicide. Schottky rectifying barriers are produced at the interfaces of the mixed silicide and N-type zones. Conductive members are formed; a first conductive member is connected to the N-type material of the first zone and the silicide of the third zone, a second conductive member is connected to the N-type material of the second zone and the silicide of the fourth zone, a third conductive member is connected in common to the silicide of the first and second zones, and a fourth conductive member is connected to the N-type material of the third and fourth zones. An AC voltage applied across the first and second conductive members produces a DC voltage across the third and fourth conductive members.

18 Claims, 14 Drawing Figures

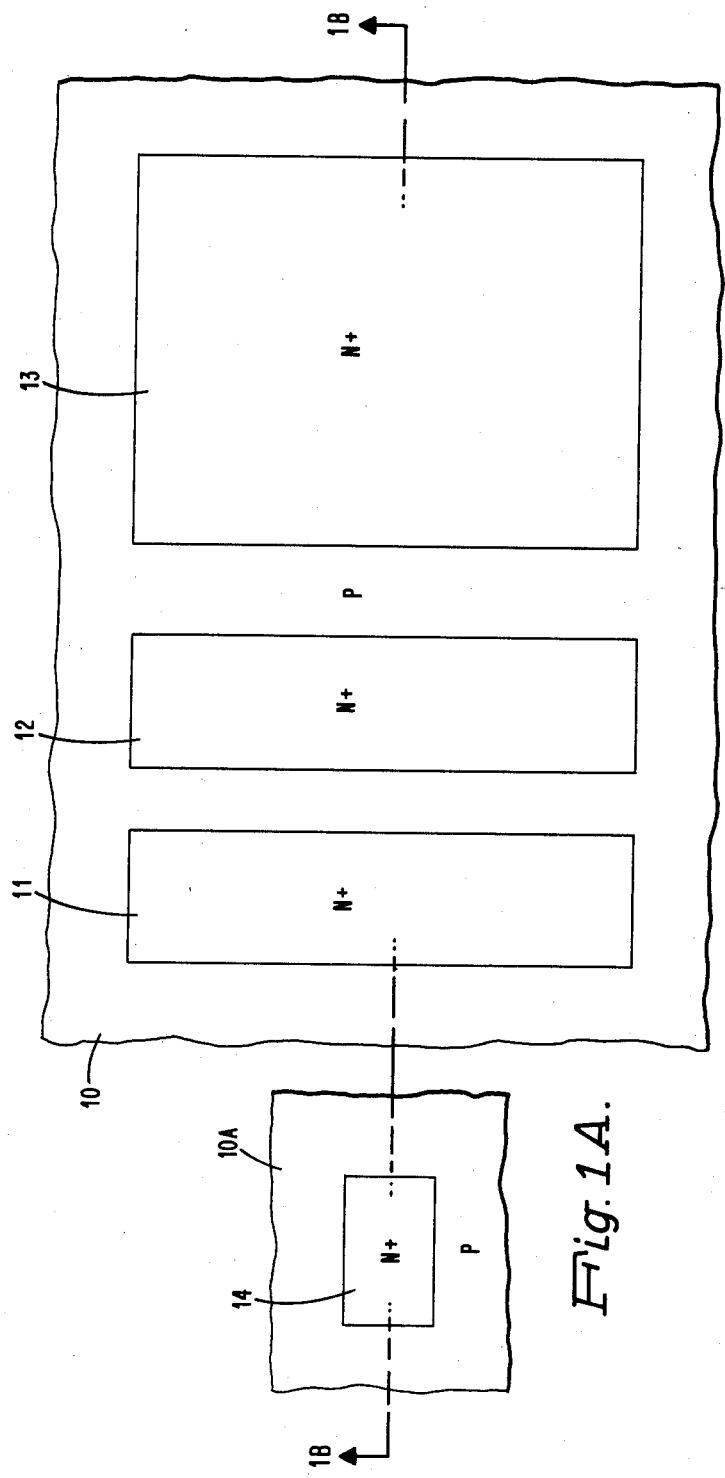
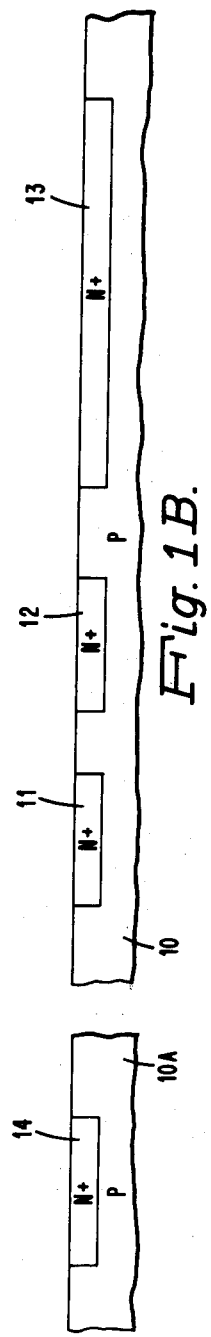
Fig. 1A.
Fig. 1B.

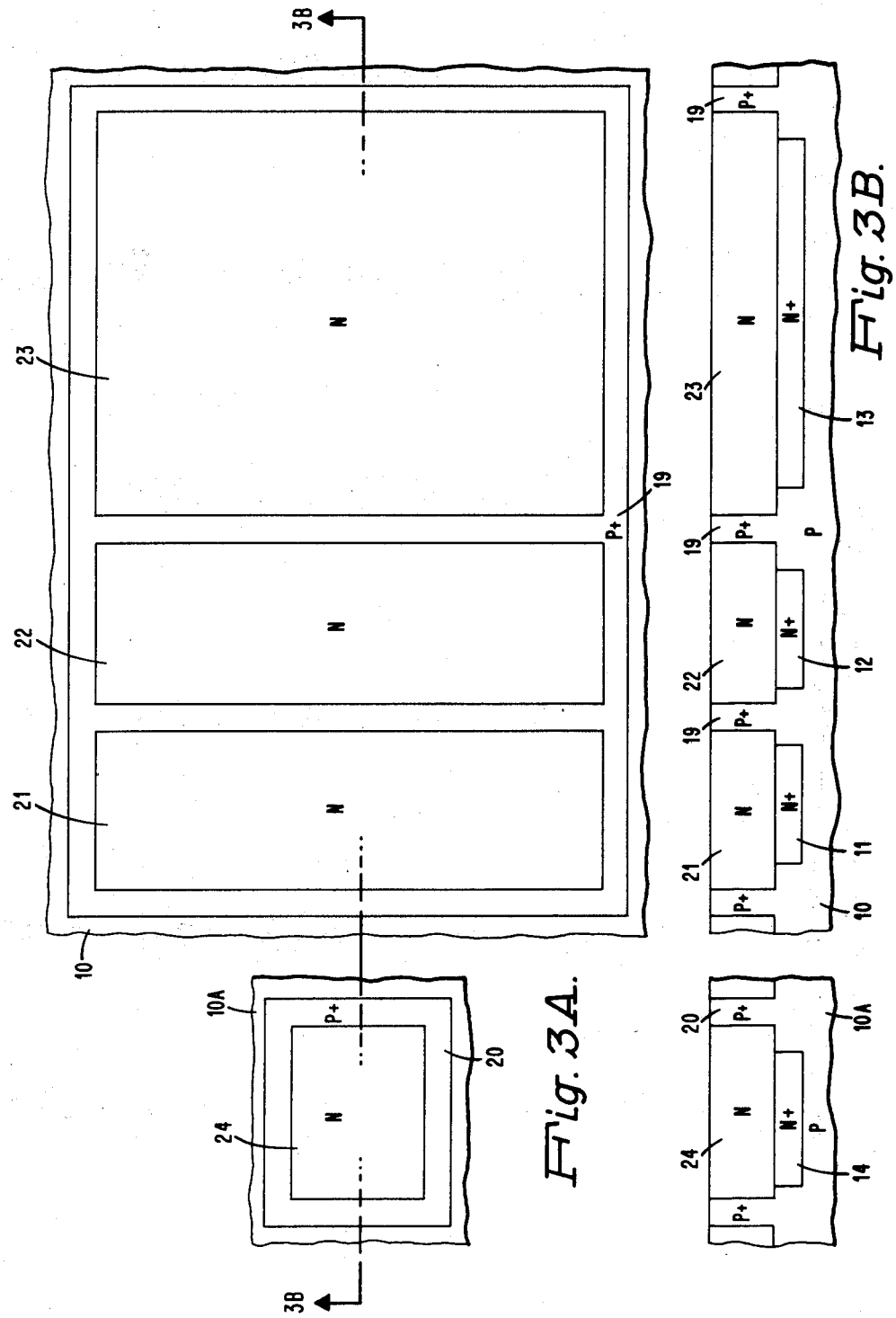

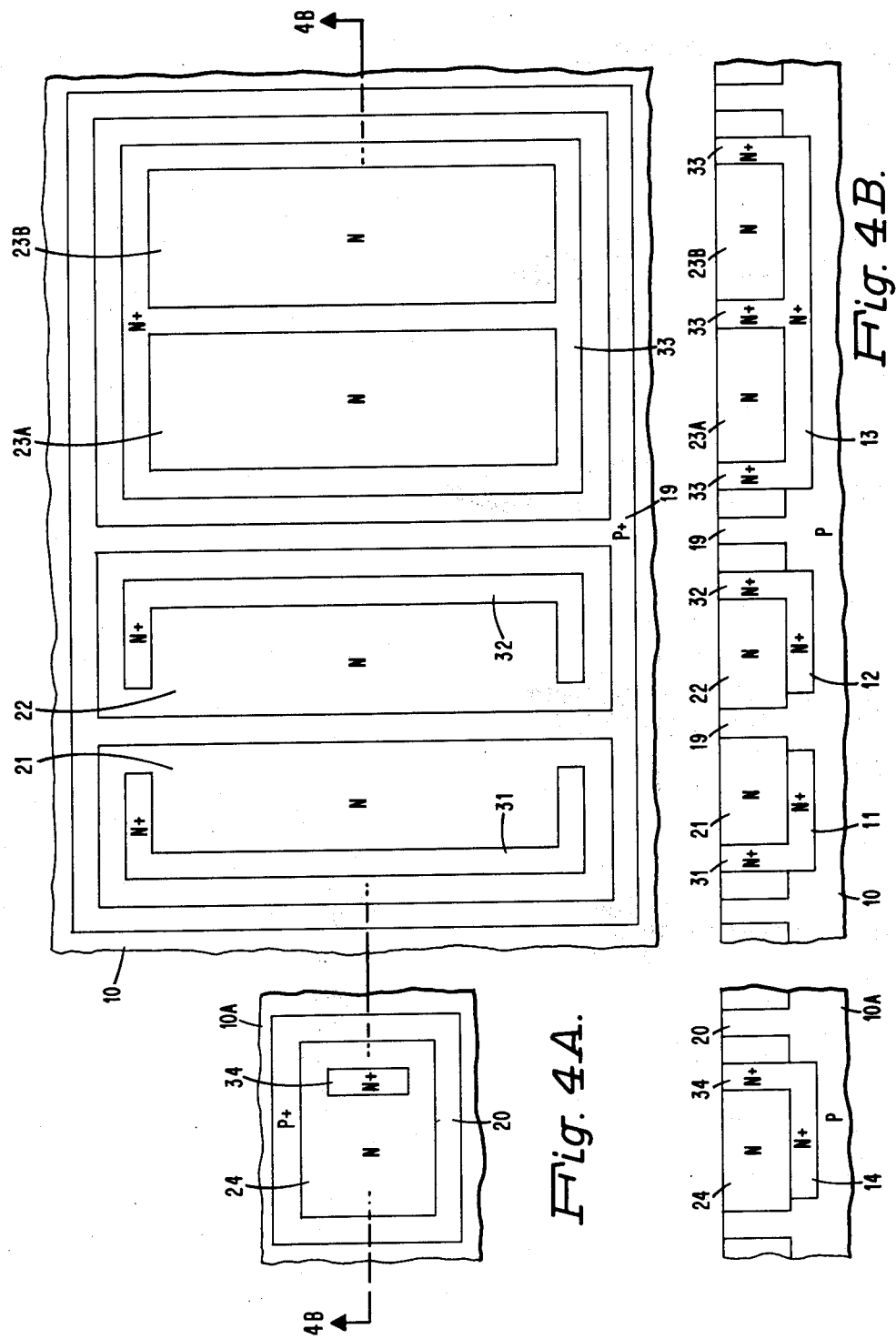

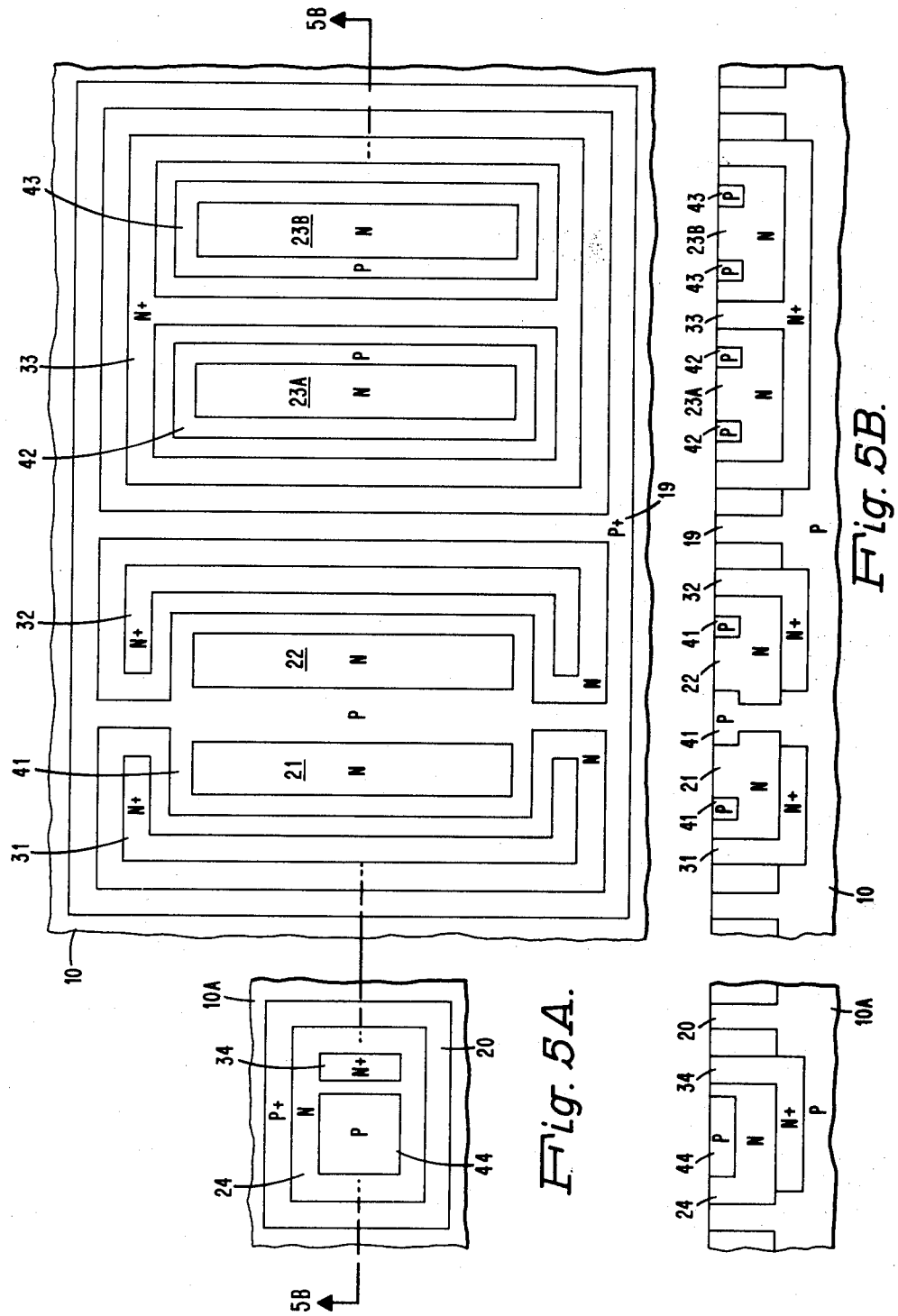

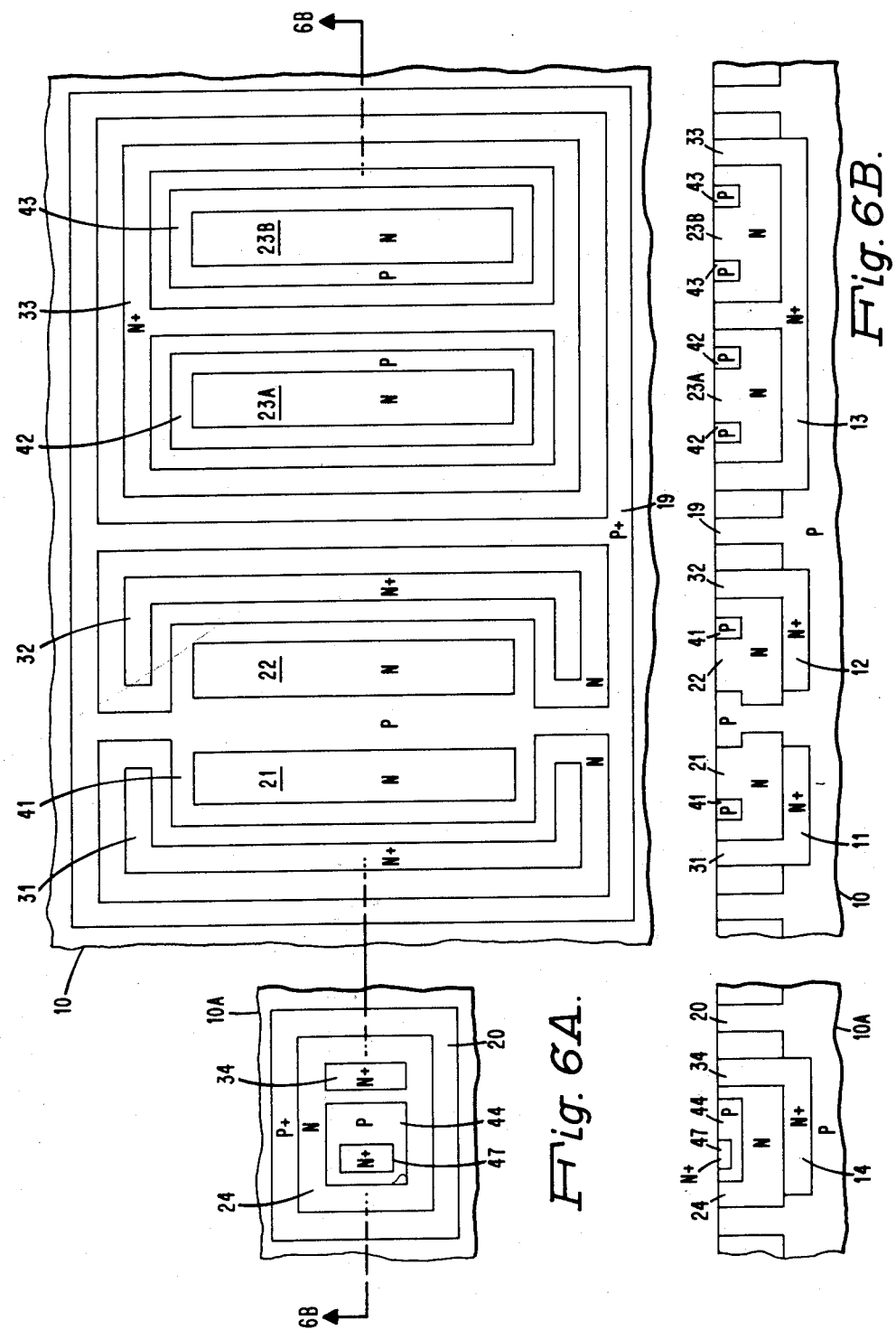

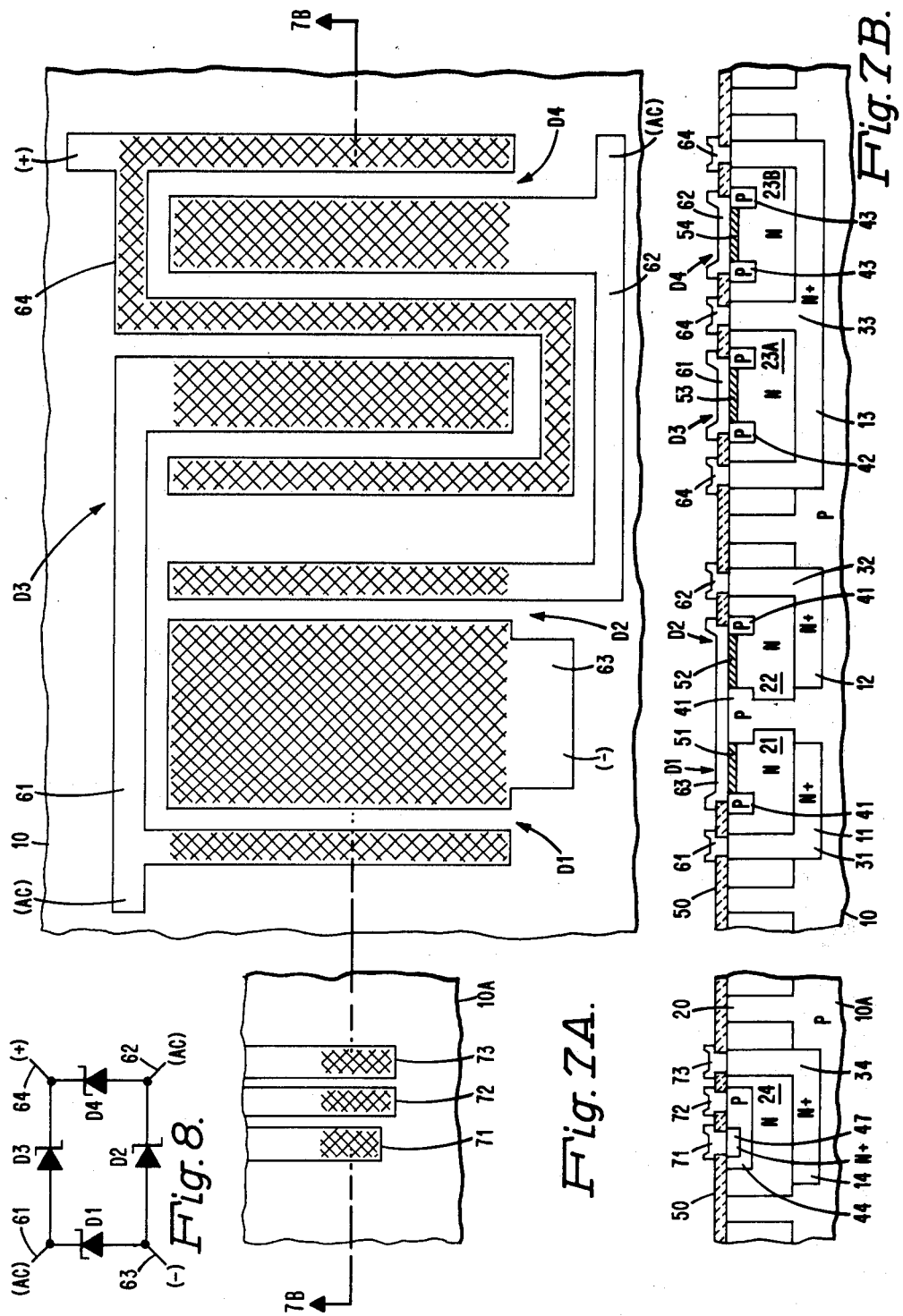

METHOD OF FABRICATING A DIODE BRIDGE RECTIFIER IN MONOLITHIC INTEGRATED CIRCUIT STRUCTURE UTILIZING ISOLATION DIFFUSIONS AND METAL SEMICONDUCTOR RECTIFYING BARRIER DIODE FORMATION

CROSS-REFERENCE TO RELATED APPLICATION

This application is related to application Ser. No. 140,038 filed concurrently herewith by William Stobbs "Monolithic Integrated Circuit Structure Incorporating Diode Bridge Rectifier" and assigned to the assignee of the present application.

BACKGROUND OF THE INVENTION

This invention relates to full-wave diode bridge rectifiers. More particularly, it is concerned with methods of fabricating full-wave diode bridge rectifiers in monolithic integrated circuit structure.

Frequently electronic circuitry which may be amenable to fabrication in monolithic integrated circuit structure requires a full-wave diode bridge rectifier. In order to utilize fully the advantages of extremely small size and manufacturing efficiency obtained with monolithic integrated circuits, it is desirable that the diode bridge also be fabricated as an integrated circuit rather than as an assembly of individual components. In many instances it is particularly desirable that the diode bridge be fabricated within the same semiconductor chip as the circuitry with which it is associated.

Previously available integrated circuit chips which included diode bridge rectifiers employed conventional junction diodes. However, parasitic transistors are inherently present when junction diode bridges are fabricated within a chip, leading to undesirable current flow and consequent low efficiency. Although by incorporating diffused guard rings in the structure the loading effect of the parasitic transistors can be reduced, large surface areas of a chip are required in order to obtain significant improvement in efficiency. As is well-understood in the semiconductor art larger surface areas make a device more expensive.

SUMMARY OF THE INVENTION

In accordance with the method of the present invention monolithic integrated circuit structure incorporating a full-wave diode bridge rectifier is produced. The structure employs metal-semiconductor rectifying barrier diodes, for example Schottky barrier diodes. Integrated circuit structure fabricated in accordance with the invention eliminates the problems of parasitic transistors while requiring less chip surface area. The monolithic integrated circuit structure includes a body of semiconductor material having a first sector which is electrically isolated from the remainder of the body by intervening semiconductor material of one conductivity type. Within the first sector is a first zone of semiconductor material of the opposite conductivity type and a second zone of semiconductor material of the opposite conductivity type; the two zones being separated from each other by an intervening barrier of semiconductor material of the one conductivity type. A first layer of metal-semiconductor rectifying barrier forming metal is in contact with the first zone and forms a rectifying barrier therebetween. A second layer of metal-semiconductor rectifying barrier forming metal is in contact with the second zone and forms a rectifying barrier therebetween.

The body of semiconductor material also includes a second sector which is electrically isolated from the remainder of the body by intervening semiconductor material of the one conductivity type. The second sector includes a third zone of semiconductor material of the opposite conductivity type and a fourth zone of semiconductor material of the opposite conductivity type. A third layer of metal-semiconductor rectifying barrier forming metal is in contact with the third zone and forms a rectifying barrier therebetween and a fourth layer of metal-semiconductor rectifying barrier forming metal is in contact with the fourth zone forming a rectifying barrier therebetween.

The structure also includes a first connection means which is in ohmic contact with the first zone of semiconductor material and is connected to the third layer of barrier forming metal. A second connection means is in ohmic contact with the second zone of semiconductor material and is connected to the fourth layer of barrier forming metal. A third connection means is connected to the first and second layers of barrier forming metal and a fourth connection means is in ohmic contact with the third and fourth zones of semiconductor material. Thus a full-wave rectifier bridge of four metal-semiconductor rectifying barrier diodes is provided so that an AC voltage across the first and second connection means produces a DC voltage across the third and fourth connection means.

Monolithic integrated circuit structures as described may be fabricated in accordance with the present invention by providing a substrate of semiconductor material of one conductivity type and growing an epitaxial layer of semiconductor material of the opposite conductivity type on a surface of the substrate to produce a body of semiconductor material. Conductivity type imparting material of the one conductivity type is diffused into portions of the epitaxial layer extending to the substrate to form isolating barriers which delineate a first sector of the opposite conductivity type electrically isolated from the remainder of the body. The first sector has first and second zones of the opposite conductivity type which are separated from each other by an intervening barrier of semiconductor material of the one conductivity type. Diffusing of the conductivity type imparting material of the one type also forms isolating barriers delineating a second sector of the opposite conductivity type which is electrically isolated from the remainder of the body.

Metal-semiconductor rectifying barrier forming metal is placed on portions of each of the four zones and the metal-semiconductor rectifying barriers are formed between the metal and the adjacent semiconductor material of the respective zones. A first electrical connection is formed in ohmic contact with the first zone of semiconductor material and connected to the barrier forming metal on the third zone. A second electrical connection is formed in ohmic contact with the second zone of semiconductor material and connected to the barrier forming metal on the fourth zone. A thid electrical connection is connected to the barrier forming metal on the first and second zones, and a fourth electrical connection is formed in ohmic contact with the third and fourth zones of semiconductor material.

BRIEF DESCRIPTION OF THE DRAWINGS

In the drawings:

FIGS. 1A through 7B are a series of plan views and elevational views in cross-section of fragments of a wafer of semiconductor material illustrating successive steps in the fabrication of a diode bridge rectifier in accordance with the present invention simultaneously with a conventional bipolar transistor; and FIG. 8 is a schematic circuit diagram of the full-wave diode bridge rectifier of the invention.

Figure 2:
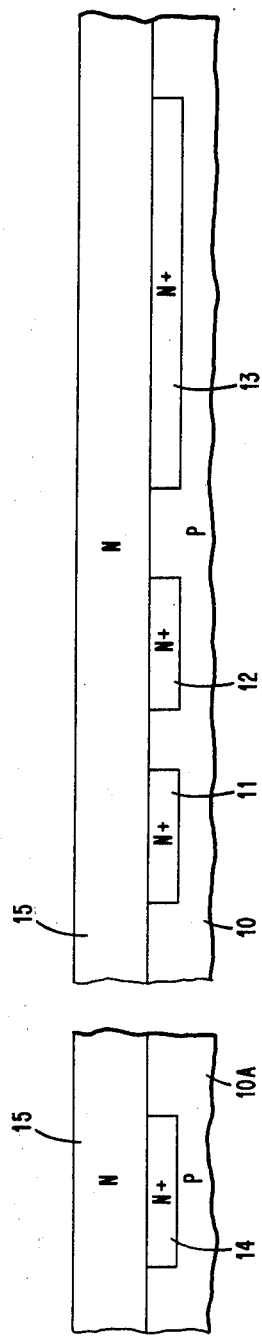

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION OF THE INVENTION

In fabricating a monolithic integrated circuit structure containing a full-wave diode bridge rectifier in accordance with the invention as illustrated in the figures a substrate of single crystal semiconductor material of one conductivity type is provided as a supporting structure. As is well-understood the substrate is usually a slice or wafer of relatively large surface area upon which many identical circuit networks each including many devices are fabricated simultaneously. However, for purposes of illustration the fabrication of only a single full-wave diode bridge rectifier and a conventional bipolar transistor in separate fragments of a slice will be shown and described. In the following description silicon is employed as the semiconductor material and the substrate is of P-type conductivity.

A slice or wafer of P-type silicon of uniform resistivity having flat, planar, parallel, opposed major surfaces, two fragments 10 and 10A of which are shown in FIGS. 1A and 1B is produced by any of known techniques of crystal fabrication including appropriate slicing and cleaning operations. A pattern of N+ type regions 11, 12, 13, and 14 are formed in the surface of the wafer by conventional diffusion techniques. In order to diffuse N-type conductivity imparting material only into the portions desired, known techniques of diffusing through openings in an adherent protective coating are employed.

In accordance with one known technique and adherent nonconductive protective coating of silicon oxide is formed on the surface of the silicon wafer. (Not shown in FIGS. 1A through 6B). The oxide coating is covered with a photoresist solution and the photoresist is exposed to ultraviolet light through a mask shielding the areas through which the conductivity type imparting material is to be diffused. The photoresist in these areas is thus not exposed to the light, and after the exposed portions are developed the unexposed resist on these areas is easily washed off while the exposed areas remain. The oxide coating unprotected by the resist is removed in an etching solution which does not attack the resist, thereby forming openings of the desired configuration in the oxide coating. The previously exposed photoresist is then dissolved to leave only the oxide coating with the openings of the desired configuration on the surface of the silicon wafer. The wafer is treated in a diffusion furnace to diffuse an N-type conductivity type imparting material through the openings in the oxide coating into the regions 11, 12, 13, and 14 of the P-type substrate.

Next as illustrated in FIG. 2 an epitaxial layer 15 of N-type silicon of uniform moderate resistivity is grown on the surface of the substrate as by known vapor decomposition techniques. A gaseous compound of silicon mixed with a controlled quantity of a gaseous compound of an N-type conductivity imparting material is reacted with a gas at the surface of the slice to cause deposition of silicon doped with the conductivity type imparting material. A layer 15 which is precisely controlled as to thickness and as to resistivity and which is a continuation of the crystalline structure of the single crystal silicon substrate 10 and 10A is thus deposited on the surface of the substrate. The upper surface of the epitaxial layer 15 is parallel to the interface between the substrate and the layer.

As illustrated in FIGS. 3A and 3B the wafer is treated in accordance with conventional techniques to diffuse P-type conductivity imparting material into selected portions of the epitaxial layer. The P-type conductivity imparting material is diffused from the surface to the underlying substrate of P-type material, thus forming isolation barriers 19 and 20 in the fragments 10 and 10A. The pattern of the P+ type isolation barriers 19 forms a first sector of a first zone 21 of N-type conductivity and a second zone 22 of N-type conductivity. The zones 21 and 22 are of the same resistivity as the original N-type material of the epitaxial layer. The zones are encircled by the P+ type isolation barriers 19 electrically isolating the two zones from the remainder of the wafer and separating them from each other. A second sector 23 of N-type conductivity is also electrically isolated from the remainder of the wafer by the P+ type isolation barrier 19 and the P-type substrate 10. In the fragment 10A the isolation barrier 20 encircles the N-type portion 24 isolating it from the remaider of the wafer.

Next as illustrated in FIGS. 4A and 4B high concentrations of N-type conductivity imparting material are diffused into the wafer to provide low resistivity contacts to the underlying buried regions. One contact region 31 extends from the surface to the underlying buried region 11 to provide N+ type material adjacent to most of the periphery of the material of moderate resistivity of the first zone 21. Similarly an N+ type contact region 32 extends to the buried region 12 to form a continuous low resistivity region adjacent to the moderate resistivity material of the second zone 22. A continuous N+ type contact region 33 of two adjacent rings encircles moderate resistivity material of the third zone 23A and fourth zone 23B. An N+ type contact type region 34 is also diffused from the surface of the fragment 10A to the underlying N+ type buried region 14.

P-type conductivity imparting material is then diffused into the wafer as illustrated in FIGS. 5A and 5B to form guard rings in the surface of each of the zones 21, 22, 23A, and 23B and a transistor base region 44 in the fragment 10A. A first P-type guard ring 41 encircles surface areas of the first and second zones 21 and 22, respectively. Separate P-type guard rings 42 and 43 encircle surface areas of the third and fourth zones 23A and 23B, respectively.

Next, the wafer is treated to diffuse heavy concentrations of N-type imparting material to a shallow depth in those portions of the N+ type contact regions where low resistance ohmic contacts are to be made subsequently. At the same time as illustrated in FIGS. 6A and 6B the N+ type emitter region 47 is formed in the P-type base region 44 of the NPN bipolar transistor being fabricated in fragment 10A.

FIG. 7B illustrates the fragments of the wafer with an adherent nonconductive protective coating 50 of silicon oxide on the surface. (Coating not shown in FIGS. 1A through 6B.) Openings are made in the oxide coating by conventional techniques as described hereinabove to expose selected portions of the underlying semiconductor surface. A layer of a mixture of titanium and tungsten is then deposited over the entire surface of the coating and exposed semiconductor material as by employing known sputtering techniques. The wafer is then heated to cause the titanium tungsten mixture to combine with the silicon adjacent to the layer to form a mixed silicide of titanium and tungsten. At the interfaces to the N-type zones 21, 22, 23A, and 23B of moderate resistivity the layers of silicide 51, 52, 53, and 54, respectively, form Schottky rectifying barriers with the adjacent silicon. In the heavily doped N+ type regions and in the P-type regions the mixed silicide of titanium and tungsten form an ohmic contact. As is well-understood the P-type guard rings 41, 42, and 43 at their interfaces with the N-type zones on which the silicides are formed precisely determine the borders of the Schottky barriers therefor influencing their characteristics.

Subsequent to heating the wafer to form the silicides a layer of aluminum is deposited over the entire surface of the layer of titanium and tungsten. The aluminum is then selectively removed as by known masking and etching techniques to produce a predetermined pattern as shown in FIGS. 7A and 7B. The wafer is then treated in a suitable etching solution to remove the exposed portions of the layer of titanium and tungsten which are not protected by the aluminum. Thus, the remaining metallization is a combination of a layer of titanium and tungsten and an overlying layer of aluminum. As illustrated in FIGS. 7A and 7B the final metallization is in the form of adherent conductive buses 61, 62, 63, 64, 71, 72, and 73 which make contact to the underlying semiconductor material or mixed silicides at the openings in the oxide coating. In FIG. 7A the contact areas are represented by cross hatching.

The conductive buses include a first bus 61 which makes ohmic contact to the N+ type contact region 31, the cathode connection of a first Schottky barrier diode labeled D1 in the equivalent circuit diagram of FIG. 8. The first conductive bus 61 is also connected to the barrier forming silicide 53 which forms the anode connection of the third Schottky barrier diode labeled D3 in the diagram of FIG. 8. A second conductive bus 62 makes ohmic contact to the contact region 32 which forms the cathode connection to a second Schottky rectifier diode labeled D2 in FIG. 8, and is also connected to the silicide 54 forming the anode connection to a fourth diode labeled D4 in FIG. 8. A third conductive bus 63 is connected to the silicide regions 51 and 52 forming a common anode connection for the first and second diodes labeled D1 and D2 in FIG. 8. As shown in the specific embodiment under discussion this bus 63 also makes ohmic contact to the P-type region 41 which extends to the substrate 10 and to all the isolation barriers. Thus, this point operates at the most negative voltage present in the structure. A fourth conductive bus 64 makes ohmic contact to the contact region 33 along a portion of its length as shown in FIG. 7A and provides a common cathode connection for the third and fourth diodes labeled D3 and D4 in the circuit diagram of FIG. 8. The metallization pattern also provides ohmic contacts to the conventional NPN bipolar transistor in fragment 10A by connections 71, 72, and 73 to the emitter, base, and collector, respectively.

Thus, as can be seen from the circuit diagram of FIG. 8 the monolithic integrated circuit as described is a full-wave rectifier of four Schottky barrier diodes. In response to an AC voltage applied across the first and second conductive buses 61 and 62 rectified DC voltage is produced across the third and fourth conductive buses 63 and 64, the third conductive bus 63 being the negative terminal and the fourth conductive bus 64 the positive terminal.

In the fabrication of an exemplary integrated circuit structure in accordance with the invention the substrate 10, 10A may be a slice of single crystal P-type silicon lightly doped with boron to produce a uniform resistivity of approximately 7 to 14 ohm-centimeters. The first N-type diffusion to form the N+ type buried regions 11, 12, 13, and 14 employs arsenic as the conductivity type imparting material. The N-type epitaxial layer 15 of silicon is doped with arsenic during deposition to provide a uniform moderate resistivity of about 4 ohms-centimeters. The N-type epitaxial layer 15 may be about 24 micrometers thick.

The first P+ type diffusion to form the isolation barrier 19 and 20 employs boron as the conductivity type imparting material. The contact regions 31, 32, 33, and 34 of N+ type material are formed by diffusing phosphorous through the epitaxial layer to the underlying buried regions. The P-type guard rings 41, 42, and 43 are formed by diffusing boron into portions of the N-type zones 21, 22, 23A, and 23B. The depth of boron diffusion affects the peak inverse voltage of the Schottky barrier diodes. When conventional bipolar transistors are also being fabricated, the diffused P-type regions should extend to a depth of 3 to 6 micrometers. The subsequent N+ type surface contact diffusion employs phosphorous as the conductivity type imparting material. The precise depth of diffusion except for the emitters of the bipolar transistor is insignificant. For emitters 47 the diffusion should extend between 1 and 5 micrometers depending upon the depth of the previous P-type base diffusion 44.

In order to obtain Schottky barrier diodes having particular desirable characteristics of 0.6 volts barrier height a mixture of titanium and tungsten is deposited as by sputtering. The amount of titanium in the mixture on the surface is between 5 and 6% by weight of the titanium tungsten mixture. The mixed silicides are formed to a depth of about 100 nanometers.

The present invention provides a full-wave diode bridge rectifier of four Schottky barrier diodes in a monolithic integrated circuit structure by employing techniques which are compatible with simultaneously fabricating conventional bipolar transistors. The use of Schottky barrier diodes in place of junction diodes eliminates parasitic transistors. Guard rings may be incorporated to improve the breakdown characteristics of the Schottky barrier diodes. If the ratio of the current across the Schottky barrier to the current across the PN junction at the guard ring is made high by appropriate selection of barrier forming metal and relative areas of Schottky barrier and PN junction, parasitic loading in the diode structure can be made insignificant. The diode bridge structure as described makes efficient use of surface area in the semiconductor wafer while providing desirable physical and operating characteristics. The bridge circuit may be fabricated as a separate individual element or as an element of a complex circuit arrangement in monolithic integrated circuit structure.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating monolithic integrated circuit structure incorporating a metal-semiconductor rectifying barrier diode bridge comprising:

providing a substrate of semiconductor material of one conductivity type;

growing an epitaxial layer of semiconductor material of the opposite conductivity type on a surface of the substrate to produce a body of semiconductor material;

diffusing conductivity type imparting material of the one conductivity type into portions of said layer extending to said substrate to form isolating barriers delineating a first sector of the opposite conductivity type electrically isolated from the remainder of the body and having a first and a second zone of the opposite conductivity type separated from each other by an intervening barrier of semiconductor material of the one conductivity type and delineating a second sector of the opposite conductivity type electrically isolated from the remainder of the body and having a third and a fourth zone of the opposite conductivity type;

placing metal-semiconductor rectifying barrier forming metal on portions of said first zone and said second zone of said one sector, on a portion of said third zone, and on a portion of said fourth zone of said second sector and forming metal-semiconductor rectifying barriers between the metal and the semiconductor material; and forming a first electrical connection in ohmic contact with the first zone of semiconductor material and connected to the metal on the third zone, a second electrical connection in ohmic contact with the second zone of semiconductor material and connected to the metal on the fourth zone, a third electrical connection connected to the metal on the first and second zones, and a fourth electrical connection in ohmic contact with the third and fourth zones of semiconductor material.

2. The method of fabricating monolithic integrated circuit structure in accordance with claim 1 including:

placing a single continuous layer of metal-semiconductor rectifying barrier forming metal on said portions of the first and second zones.

3. The method of fabricating monolithic integrated circuit structure in accordance with claim 2 wherein:

said third and fourth zones of semiconductor material of the opposite conductivity type are contiguous, forming a section of the opposite conductivity type;

and including placing separate layers of metal-semiconductor rectifying barrier forming metal on said portions of the third and fourth zones; and forming said fourth electrical connection in ohmic contact with said section of the opposite conductivity type.

4. The method of fabricating monolithic integrated circuit structure in accordance with claim 3 wherein:

the metal-semiconductor rectifying barriers formed between rectifying barrier forming metal and semiconductor material are Schottky barrier diodes.

5. The method of fabricating monolithic integrated circuit structure in accordance with claim 4 wherein:

the semiconductor material is silicon; and placing metal-semiconductor rectifying barrier forming metal and forming metal-semiconductor rectifying barriers includes depositing a mixture of titanium and tungsten on said portions of the first and second zones, on said portion of the third zone and on said portion of the fourth zone, and heating to form a mixed silicide of titanium and tungsten which provides a metal-semiconductor rectifying barrier with the adjacent silicon at each of said portions.

6. The method of fabricating monolithic integrated circuit structure in accordance with claim 5 wherein the deposited mixture of titanium and tungsten contains about 5% titanium by weight.

7. The method of fabricating monolithic integrated circuit structure in accordance with claim 5 wherein the one conductivity type is P-type; and the opposite conductivity type is N-type.

8. The method of fabricating monolithic integrated circuit structure incorporating a metal-semiconductor rectifying barrier diode bridge comprising providing a substrate of semiconductor material of one conductivity type having a flat planar surface;

growing an epitaxial layer of semiconductor material of the opposite conductivity type on said surface of the substrate, said layer having a flat planar surface parallel to the interface of the layer and the substrate, said substrate and layer forming a body of semiconductor material;

diffusing conductivity type imparting material of the one conductivity type into selected portions of said layer from the surface to said substrate to form isolating barriers of semiconductor material of the one conductivity type delineating a first sector of the opposite conductivity type electrically isolated from the remainder of the body and having a first and a second zone of the opposite conductivity type separated from each other by an intervening barrier of semiconductor material of the one conductivity type and delineating a second sector of the opposite conductivity type electrically isolated from the remainder of the body and having a third and a fourth zone of the opposite conductivity type;

forming an adherent nonconductive coating on the surface of the layer;

placing metal-semiconductor rectifying barrier forming metal on portions of the surface of said first zone and said second zone of said one sector, on a portion of the surface of said third zone, and on a portion of the surface of said fourth zone of said second sector at openings in said coating and forming metal-semiconductor rectifying barriers between the metal and the semiconductor material; and placing conductive material on predetermined areas of said coating to form conductive buses including a first conductive bus in ohmic contact with the first zone of semiconductor material at an opening in the coating and connected to the metal on the surface of the third zone, a second conductive bus in ohmic contact with the second zone of semiconductor material at an opening in the coating and connected to the metal on the surface of the fourth zone, a third conductive bus connected to the metal on the surfaces of the first and second zones, and a fourth conductive bus in ohmic contact with the third zone of semiconductor material at an opening in the coating and in ohmic contact with the fourth zone of semiconductor material at an opening in the coating.

9. The method of fabricating monolithic integrated circuit structure in accordance with claim 8 including
forming a single continuous opening in said coating exposing the portions of the surfaces of the first and second zones of the one sector; and
placing a single continuous layer of metal-semiconductor rectifying barrier forming metal on said portions of the surface of the first and second zones exposed by the opening.

10. The method of fabricating monolithic integrated circuit structure in accordance with claim 9 wherein
said third and fourth zones of semiconductor material of the opposite conductivity type are contiguous, forming a section of the opposite conductivity type; and including
forming separate openings in said coating exposing the portion of the surface of the third zone and the portion of the surface of the fourth zone; and
placing separate layers of metal-semiconductor rectifying barrier forming metal on said portions of the surfaces of the third and fourth zones exposed by the openings.

11. The method of fabricating monolithic integrated circuit structure in accordance with claim 10 including prior to placing metal-semiconductor rectifying barrier forming metal and forming metal-semiconductor rectifying barriers the steps of
diffusing conductivity type imparting material of the one conductivity type into selected portions of said epitaxial layer at the surface thereof to form
a first ring of the one conductivity type in the first zone encircling said portion of the surface of the first zone,
a second ring of the one conductivity type in the second zone encircling said portion of the surface of the second zone,
a third ring of the one conductivity type in the third zone encircling said portion of the surface of the third zone, and
a fourth ring of the one conductivity type in the fourth zone encircling said portion of the surface of the fourth zone; and
forming first, second, and third openings in said coating, said first opening exposing said portions of the surface of the first and second zones and the portions of the first and second rings at the interface of the rings and the first and second zones, said second opening exposing said portion of the surface of the third zone and the portion of the third ring at the interface of the ring and the third zone, and said third opening exposing said portion of the surface of the fourth zone and the portion of the fourth ring at the interface of the ring and the fourth zone; and wherein placing metal-semiconductor rectifying barrier forming metal includes
placing metal-semiconductor rectifying barrier forming metal on the surface areas exposed by the first, second, and third openings.

12. The method of fabricating monolithic integrated circuit structure in accordance with claim 11 wherein
the metal-semiconductor rectifying barriers formed between rectifying barrier forming metal and semiconductor material are Schottky barrier diodes.

13. The method of fabricating monolithic integrated circuit structure in accordance with claim 12 including prior to growing the epitaxial layer the step of
diffusing conductivity type imparting material of the opposite conductivity type into predetermined first, second, and third portions of the substrate to form regions of the opposite conductivity type of low resistivity, which upon subsequent growing of the epitaxial layer and diffusing of conductivity type imparting material of the one conductivity type to form isolating barriers become buried regions of the zones of the opposite conductivity type, said first portion becoming a buried region of the first zone, said second portion becoming a buried region of the second zone, and said third portion becoming a buried region of said third and fourth zones.

14. The method of fabricating monolithic integrated circuit structure in accordance with claim 13 including the step of
diffusing conductivity type imparting material of the opposite conductivity type into selected portions of the first and second sectors to form contact regions of the opposite conductivity type of low resistivity extending from the surface to the buried regions of the opposite conductivity type.

15. The method of fabricating monolithic integrated circuit structure in accordance with claim 14 wherein
the interface of the contiguous third and fourth zones of the opposite conductivity type includes a portion of a contact region of the opposite conductivity type of low resistivity.

16. The method of fabricating monolithic integrated circuit structure in accordance with claim 12 wherein
the semiconductor material is silicon; and
placing metal-semiconductor rectifying barrier forming metal and forming metal-semiconductor rectifying barriers includes
depositing a mixture of titanium and tungsten on said portions of the surface of the first and second zones, on said portion of the surface of the third zone, and on said portion of the surface of the fourth zone, and
heating to form a mixed silicide of titanium and tungsten which provides a metal-semiconductor rectifying barrier with the adjacent silicon at each of said portions.

17. The method of fabricating monolithic integrated circuit structure in accordance with claim 16 wherein
the deposited mixture of titanium and tungsten contains about 5% titanium by weight.

18. The method of fabricating monolithic integrated circuit structure in accordance with claim 16 wherein
the one conductivity type is P-type; and
the opposite conductivity type is N-type.

* * * * *